United States Patent
Itoh et al.

(10) Patent No.: US 7,799,621 B2
(45) Date of Patent: Sep. 21, 2010

(54) METHOD OF MANUFACTURING THIN FILM TRANSISTOR ARRAY SUBSTRATE AND DISPLAY DEVICE

(75) Inventors: Yasuyoshi Itoh, Tokyo (JP); Toshio Araki, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/266,064

(22) Filed: Nov. 6, 2008

(65) Prior Publication Data

US 2009/0121227 A1    May 14, 2009

(30) Foreign Application Priority Data

Nov. 13, 2007   (JP) .............................. 2007-294249

(51) Int. Cl.
   *H01L 29/786* (2006.01)
(52) U.S. Cl. ............................... 438/149; 257/E21.411
(58) Field of Classification Search ................. 438/149, 438/151, 164; 257/59, E21.411, E21.412, 257/E21.413, E21.414
   See application file for complete search history.

(56) References Cited

U.S. PATENT DOCUMENTS

| 6,184,945 | B1 | 2/2001 | Sung |
| 2002/0001777 | A1 | 1/2002 | Kido |
| 2002/0009890 | A1 | 1/2002 | Hayase et al. |
| 2003/0063249 | A1 | 4/2003 | Hoshino et al. |
| 2004/0174645 | A1* | 9/2004 | Nojiri et al. .................... 361/56 |
| 2006/0228839 | A1* | 10/2006 | Liao ........................... 438/151 |

FOREIGN PATENT DOCUMENTS

| JP | 11-64884 | 3/1999 |
| JP | 2002-26011 | 1/2002 |
| JP | 2002-263333 | 1/2002 |
| JP | 2003-172946 | 6/2003 |
| JP | 2004-104134 | 4/2004 |
| JP | 2004-318076 | 11/2004 |
| JP | 2007-59926 | 3/2007 |

\* cited by examiner

*Primary Examiner*—Matthew Smith
*Assistant Examiner*—Michele Fan
(74) *Attorney, Agent, or Firm*—Oblon, Spivak, McClelland, Maier & Neustadt, L.L.P.

(57) ABSTRACT

A method of manufacturing a thin film transistor array substrate according to the present invention includes: forming a pattern made of a first conductive film; stacking a gate insulating film, a semiconductor layer, and a resist in the stated order; forming a resist pattern having a step structure in a thickness direction; forming an exposed area of the first conductive film and a pattern of the semiconductor layer by using the resist pattern; forming a pattern made of a second conductive film in contact with the first conductive film in the exposed area of the first conductive film; and forming a pattern made of a third conductive film. The first conductive film forms a gate electrode, and the second conductive film forms each of a source electrode and a drain electrode. The third conductive film forms a pixel electrode, and the second conductive film is coated with an upper-layer film.

13 Claims, 15 Drawing Sheets

METHOD OF MANUFACTURING THIN FILM TRANSISTOR ARRAY SUBSTRATE AND DISPLAY DEVICE

BACKGROUND OF THE INVENTION

1. Field of the Invention

The present invention relates to a method of manufacturing a thin film transistor array substrate and a display device.

2. Description of Related Art

Thin film transistors (hereinafter, also referred to as "TFTs") are widely used as transistors for driving pixels of an active-matrix liquid-crystal display (AMLCD). Among the TFTs, TFTs having an amorphous silicon (Si) film used as a semiconductor film are produced with high productivity and widely applied to various fields, since the TFTs can be manufactured with a small number of manufacturing steps and the size of an insulating substrate for the TFTs can be easily increased.

A manufacturing process for a TFT array substrate requires at least five different etching processes. Further, in order to form a resist pattern corresponding to each of the etching processes, five photolithography processes are required. To carry out the five photolithography processes, five photomasks are used (see, for example, Japanese Unexamined Patent Application Publication No. 11-64884).

In recent years, a method of further reducing the number of manufacturing steps in order to reduce manufacturing costs has been proposed. The number of manufacturing steps is reduced by using, for example, so-called multi-gradation exposure and lift-off techniques. According to the multi-gradation exposure technique, a resist film thickness can be intentionally varied. In order to vary the resist film thickness, it is necessary to form a halftone area that allows an amount of light smaller than that of light passing through a transparent substrate, on a photomask. As a method of forming the halftone area, a method using a gray tone mask and a method using a halftone mask are known. The gray tone mask is used to control the amount of transmitted light in a portion in which micropatterns that are unresolved during a photolithography process are arranged in a slit shape or a matrix shape. The halftone mask is used to form the halftone area using a translucent film.

Japanese Unexamined Patent Application Publication No. 2002-26333 (Hayase et al.) discloses a method of manufacturing an inversely-staggered liquid crystal display device including an electrostatic protection circuit section by using a four-mask technique. Japanese Unexamined Patent Application Publication No. 2004-318076 (Lee et al.) discloses a method of manufacturing a lateral electric field driven liquid crystal display. Further, Japanese Unexamined Patent Application Publication No. 2002-26011 (Kido et al.) discloses a method of manufacturing a liquid crystal display device including an inversely-staggered TFT enabling a reduction in the number of manufacturing processes, by using the lift-off technique in combination with the multi-gradation exposure technique.

Hayase et al. discloses a structure in which a transparent conductive film (transparent electrode layer) is formed on source/drain electrodes without an interlayer insulating film interposed therebetween so as to electrically connect the source/drain electrodes and a gate electrode through the transparent conductive film. In this case, ITO, ITZO, IZO, or the like, which is generally used for the transparent conductive film, has a volume resistivity that is about two orders of magnitude greater than that of a metallic material generally used for the gate electrode and source/drain electrodes. For this reason, when the source/drain electrodes and the gate electrode are electrically connected to each other through the transparent conductive film, it is necessary to adequately secure an area in contact with the transparent conductive film in order to suppress an increase in resistance.

The liquid crystal display device disclosed in Lee et al. has a structure in which a transparent conductive film such as ITO is not used, which leads to a cost reduction. In the liquid crystal display device, however, metal is exposed through an opening serving as a terminal section to receive an external signal and the like, which causes a problem in that the metal of the terminal section is more likely to corrode in the external atmosphere. Further, in the device disclosed in Lee et al., a contact hole is formed in stacked films of a gate insulating film and a semiconductor film. Thus, surface unevenness occurs at a part of the contact hole, which deteriorates the coverage of the conductive film formed on an upper layer and in the contact hole, at a contact hole portion. This may lead to a malfunction such as disconnection.

Kido et al. discloses a structure in which a Cr conductive film forming a gate electrode, and a metal conductive film forming source/drain electrodes are electrically connected to each other through a transparent conductive film. Thus, as in Hayase et al., it is necessary to adequately secure an area in contact with the transparent conductive film in order to suppress an increase in resistance.

In recent years, there is an increasing demand for reducing the whole size of display devices while securing a display area. Accordingly, there is a need for a structure in which a frame area located outside the display area is reduced. Furthermore, there is a need for a display device with high reliability.

SUMMARY OF THE INVENTION

The present invention has been made in view of the above circumstances, and therefore an object of the present invention is to provide a method of manufacturing a thin film transistor array substrate excellent in reliability and attaining cost reduction while realizing a narrower frame.

According to an aspect of the present invention, there is provided a method of manufacturing a thin film transistor array substrate, including the steps of: forming a pattern made of a first conductive film on a substrate; stacking a gate insulating film, a semiconductor layer, and a resist in the stated order on the first conductive film; forming a resist pattern having a step structure in a thickness direction by using a photolithography process with a photomask disposed on the resist; forming an exposed area of the first conductive film and a pattern of the semiconductor layer by using the resist pattern; forming a pattern made of a second conductive film in contact with the first conductive film in the exposed area of the first conductive film; and forming a pattern made of an interlayer insulating film and a pattern made of a third conductive film on the second conductive film. The thin film transistor array substrate has a conductive film connecting region in which the first conductive film and the second conductive film are in direct contact with each other through an opening formed in the gate insulating film, and in which the second conductive film is coated with an upper-layer film. Further, the first conductive film forms a gate electrode of a thin film transistor. The second conductive film forms each of a source electrode and a drain electrode of the thin film transistor. The third conductive film forms a pixel electrode.

The present invention has excellent effects of providing a method of manufacturing a thin film transistor array substrate excellent in reliability and attaining cost reduction while realizing a narrower frame.

The above and other objects, features and advantages of the present invention will become more fully understood from the detailed description given hereinbelow and the accompanying drawings which are given by way of illustration only, and thus are not to be considered as limiting the present invention.

DETAILED DESCRIPTION OF THE EXEMPLARY EMBODIMENTS

Exemplary embodiments of the present invention will be described below. The sizes and ratios of components illustrated in the accompanying drawings are selected for ease of explanation and are not limited to those described herein.

First Exemplary Embodiment

A display device according to a first exemplary embodiment of the present invention is a display device which includes an active-matrix TFT array substrate having an inversely-staggered thin film transistor (TFT) of a MOS structure mounted thereon as a switching element. A transmissive liquid crystal display device is herein described as an example of the display device.

Figure 1:
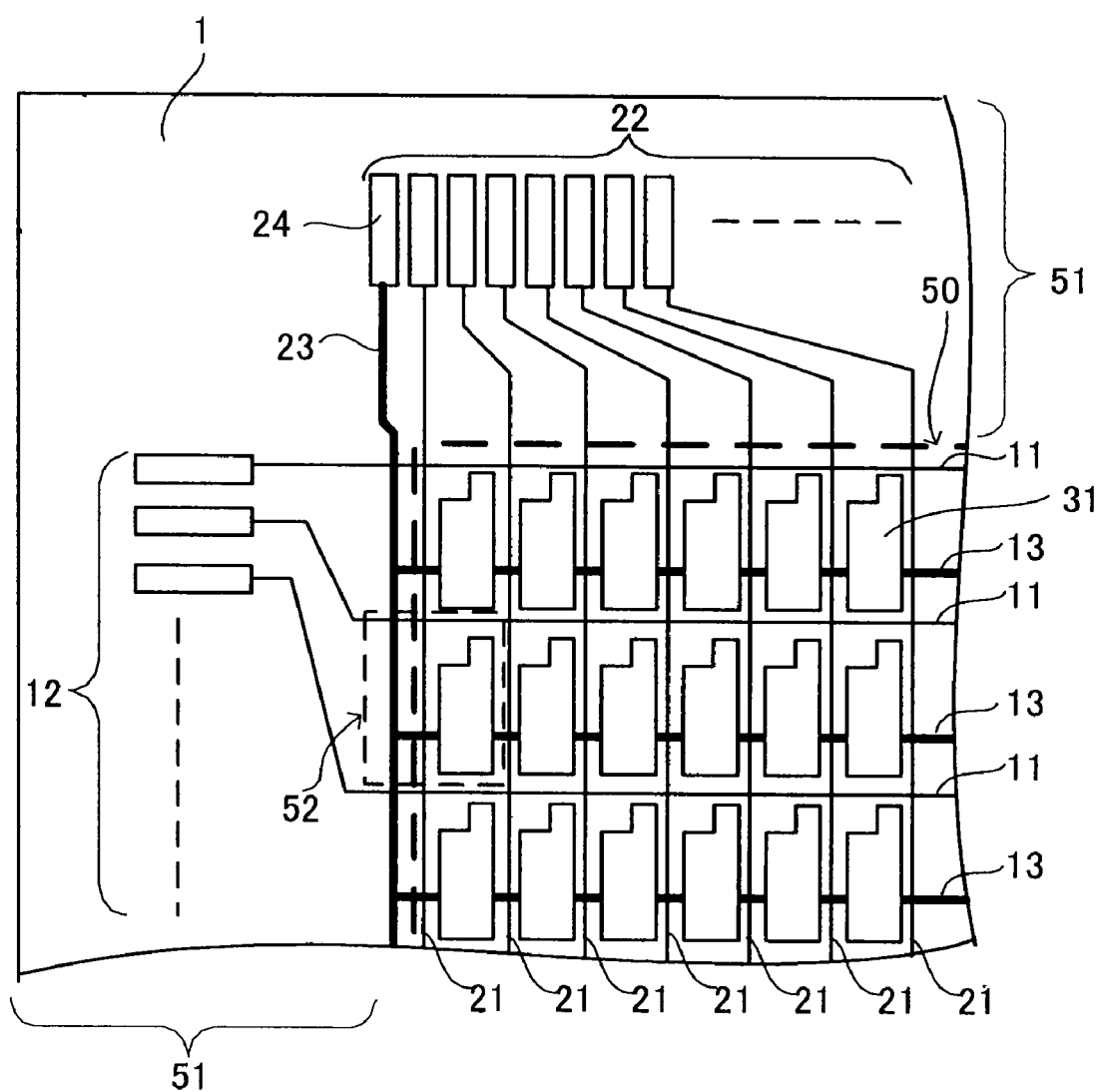
FIG. 1 is a partial enlarged top view schematically showing a TFT array substrate according to a first exemplary embodiment of the present invention.

FIG. 1 is a plane view showing a TFT array substrate 80 according to the first exemplary embodiment. Referring to FIG. 1, the TFT array substrate 80 includes gate lines 11, gate-line-side terminals 12, common capacitor lines 13, source lines 21, source-line-side terminals 22, a common line 23, a common terminal 24, and pixel electrodes 31.

The plurality of gate lines 11 each extend laterally in FIG. 1 and are longitudinally disposed in parallel with each other. The plurality of source lines 21 each extend longitudinally in FIG. 1 and are laterally disposed in parallel with each other so that the source lines 21 cross the gate lines 11 with a gate insulating film (not shown) interposed therebetween. The plurality of gate lines 11 and the plurality of source lines 21 are arranged substantially orthogonal to each other and form a matrix. The pixel electrodes 31 are respectively formed in areas each surrounded by adjacent ones of the gate lines 11 and adjacent ones of the source lines 21. Each of the areas functions as a pixel, and an area formed of a plurality of pixels is a display area 50. An area located outside the display area 50 is a frame area 51.

The plurality of gate-line-side terminals 12 are arranged on the left side of FIG. 1 in the frame area 51, and the gate lines 11 respectively extend to the gate-line-side terminals 12 from the display area 50. Similarly, the plurality of source-line-side terminals 22 are arranged on the upper side of FIG. 1 in the frame area 51, and the source lines 21 respectively extend to the source-line-side terminals 22 from the display area 50.

The common capacitor lines 13 for forming a capacitor are respectively formed in the pixels in parallel with the gate lines 11, and are each connected to the common line 23 in the frame area 51. The common line 23 is made of a second conductive film, which is formed in the same layer as that of the source lines 21, at the outermost line of the plurality of source lines 21 so as to be in parallel with the source lines. Further, the common line 23 extends to the common terminal 24. The common terminal 24 is a terminal for supplying a common electric potential from the outside and is disposed at an end of the plurality of source-line-side terminals 22, which are arranged in a row, in the example shown in FIG. 1.

Figure 2:
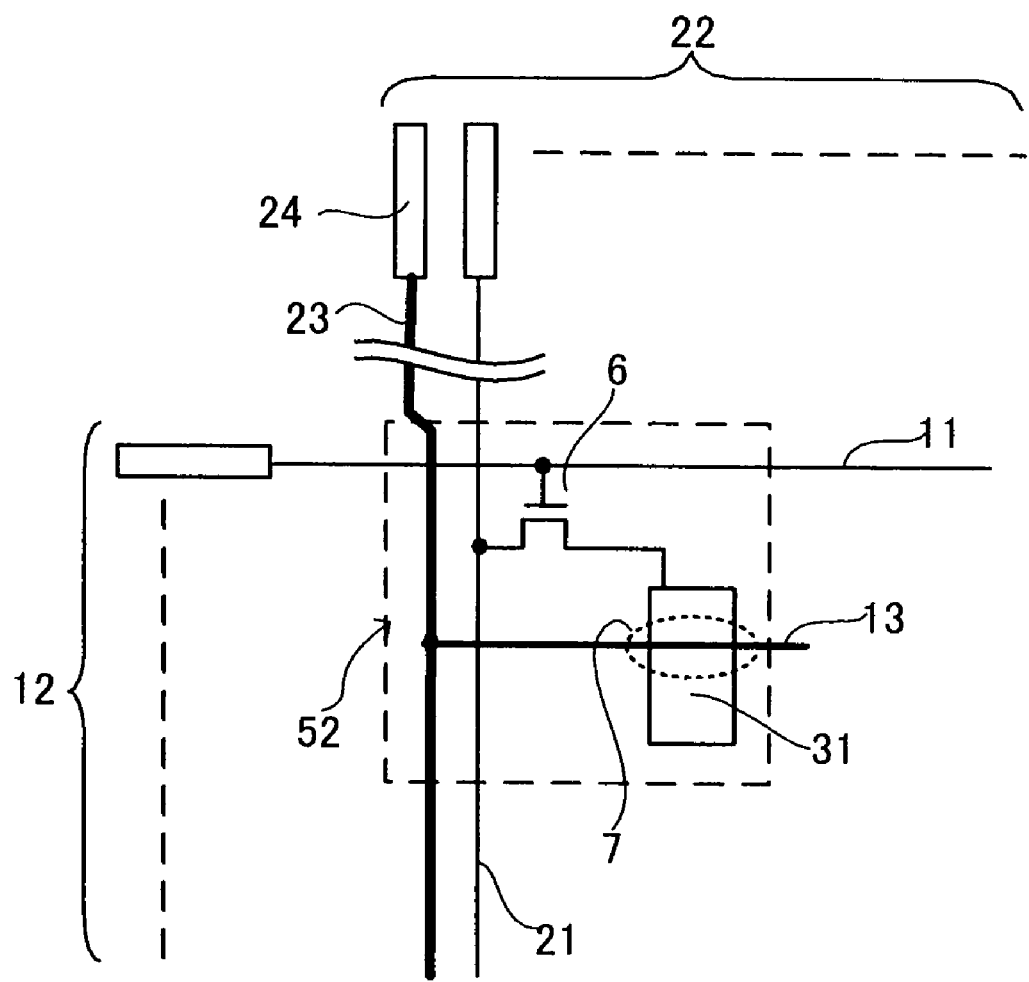
FIG. 2 is a schematic circuit diagram showing the vicinity of a pixel according to the first exemplary embodiment.

FIG. 2 is a schematic circuit diagram showing the vicinity of an area denoted by reference numeral 52 of FIG. 1. Referring to FIG. 2, in the vicinity of an intersection between each of the gate lines 11 and each of the source lines 21 of the pixels, at least one TFT 6 for transmitting signals is provided. A gate electrode of the TFT 6 formed in each pixel is connected to the gate line 11, and a source electrode of the TFT 6 is connected to the source line 21.

When signals are applied to the gate line 11, a signal charge transferred from the source line 21 is written into each pixel, thereby accumulating electric charges in a storage capacitor 7. In this case, the pixel electrodes 31 apply electric potentials corresponding to the written signals to a liquid crystal, to thereby display a desired image. Each of the pixel electrodes 31 is used as one of electrodes for accumulating a signal charge of each pixel, and each of the common capacitor lines 13 is used as a counter electrode. The common capacitor lines 13 are each formed of the same layer (first conductive film) as that of the gate lines 11. Further, the common capacitor lines 13 are disposed so as to be connected to all the pixels and cross the source lines 21 with a gate insulating layer interposed therebetween.

Figure 3:
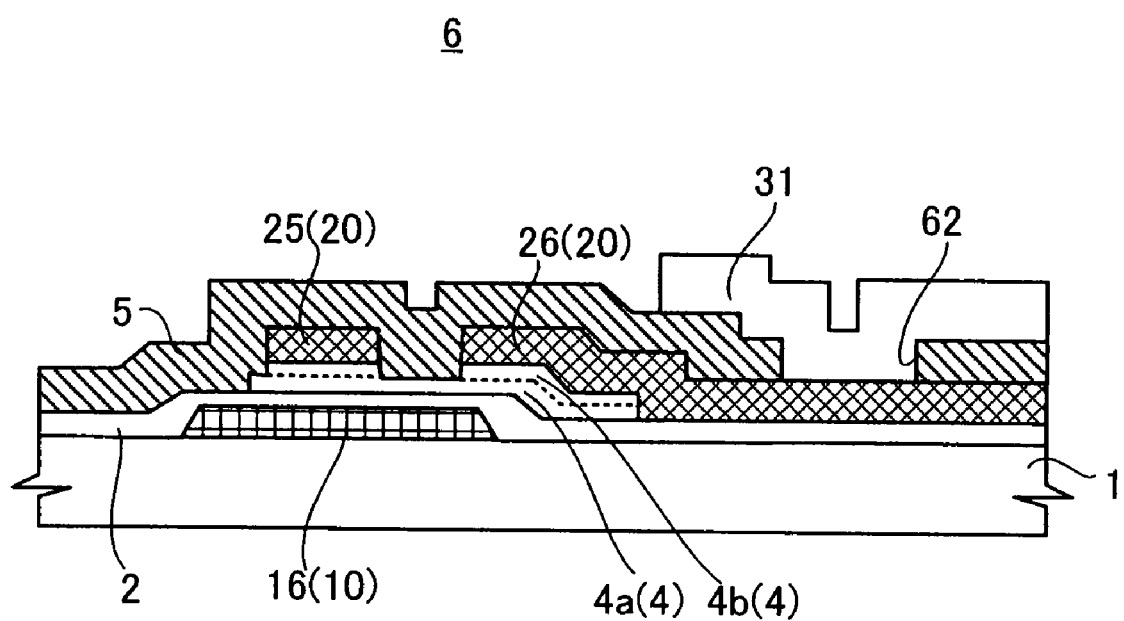
FIG. 3 is a cross-sectional view of the TFT according to the first exemplary embodiment.

FIG. 3 is a schematic cross-sectional view showing the vicinity of the TFT 6 according to the first exemplary embodiment. The TFT 6 is an inversely-staggered TFT that is manufactured by channel etching (CE). Referring to FIG. 3, the TFT 6 includes an insulating substrate 1, a gate electrode 16, a gate insulating film 2, semiconductor layers of a first semiconductor layer 4a and a second semiconductor layer 4b, a source electrode 25, a drain electrode 26, an interlayer insulating film 5, and the pixel electrode 31.

As the insulating substrate 1, a substrate having transparency, such as a glass substrate or a crystal substrate, is used. The gate electrode 16 is formed on the insulating substrate 1 and is made of the first conductive film which is formed in the same layer as that of the gate line 11, the common capacitor line 13, a common capacitor electrode layer 15, and the like. The gate insulating film 2 is formed on the gate electrode 16 so as to cover the gate electrode 16. The first semiconductor layer 4a is formed on the gate insulating film 2, and at least a part of the first semiconductor layer 4a is opposed to the gate electrode 16 with the gate insulating film 2 interposed therebetween.

The second semiconductor layer 4b is formed on the first semiconductor layer 4a. The source electrode 25 and the drain electrode 26 are formed on the second semiconductor layer 4b. A region of the second semiconductor layer 4b, on which the source electrode 25 is stacked, is a source region, and a region of the second semiconductor layer 4b, on which the drain electrode 26 is stacked, is a drain region. In the first semiconductor layer 4a, a region sandwiched between a portion of the first semiconductor layer 4a, which is positioned below the source region, and a portion of the first semiconductor layer 4a, which is positioned below the drain region, is a channel region.

The source electrode 25 and the drain electrode 26 are opposed to at least a part of the gate electrode 16 with the gate insulating film 2, the first semiconductor layer 4a, and the second semiconductor layer 4b interposed therebetween. In short, to provide a function of a TFT, a channel region is formed on the gate electrode 16 so as to be easily affected by an electric field when a voltage is applied to the gate electrode.

The interlayer insulating film 5 is formed to cover the channel region, the source electrode 25, and the drain electrode 26 (see FIG. 3). Further, the pixel electrode 31 is formed on the interlayer insulating film 5. The drain electrode 26 and the pixel electrode 31 are electrically connected to each other through a second contact hole 62 formed in the interlayer insulating film 5.

Next, a description is given of a method of electrically connecting the common capacitor lines 13 to the common line 23. As described above, each of the common capacitor lines 13 for forming a capacitor is made of a first conductive film 10 which is formed in the same layer as that of the gate lines 11, and the common line 23 is made of the second conductive film which is formed in the same layer as that of the source lines 21. In the frame area 51, the common capacitor lines 13 and the common line 23 are electrically connected to each other. Note that a material normally used for forming a gate electrode of a thin film transistor is used for forming the "first conductive film", and a material normally used for forming source/drain electrodes of a thin film transistor is used for forming the "second conductive film". In other words, the first and second conductive films are each made of metal or materials mainly composed of metal and have the same volume resistivity as that of metal.

Figure 12:
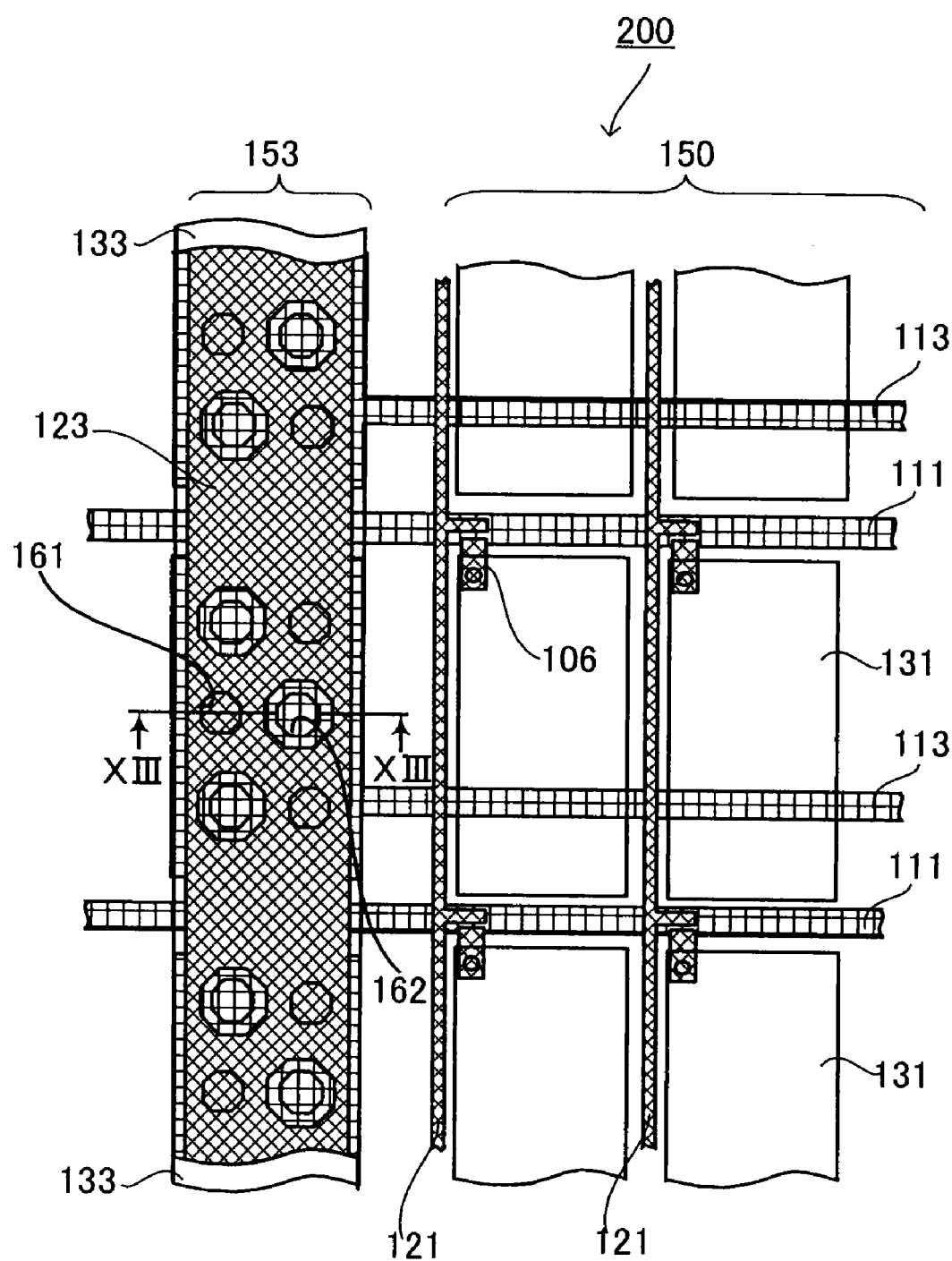
FIG. 12 is a top view showing the vicinity of a line conversion section of a TFT array substrate according to Comparative Example 1.
Figure 13:
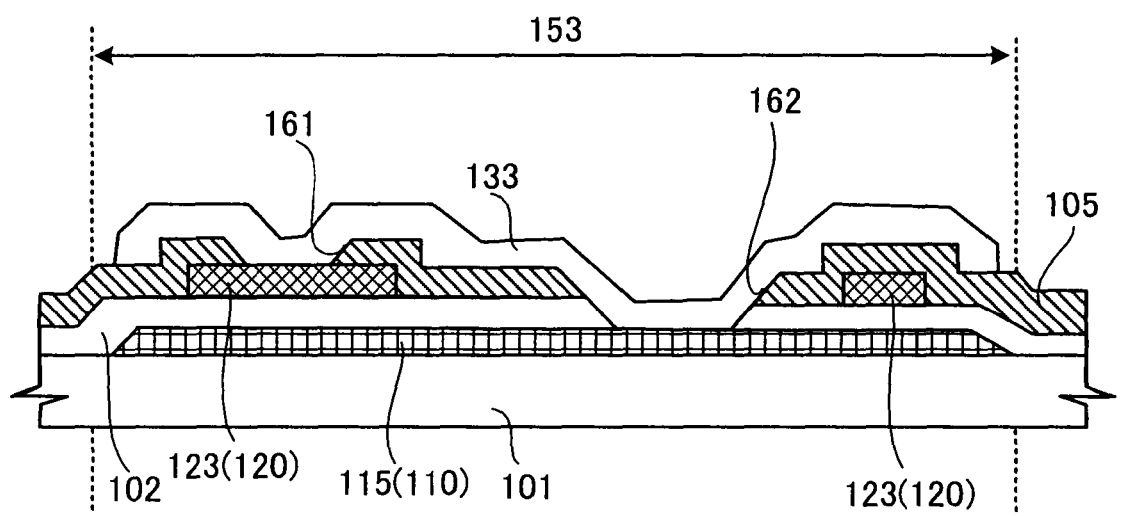
FIG. 13 is a cross-sectional view taken along the line XIII-XIII of FIG. 12.

Referring to FIGS. 12 and 13, a description is given of a method of electrically connecting common capacitor lines to common lines according to Comparative Example 1. FIG. 12 is a schematic top view showing the common capacitor lines and the common lines in the vicinity of a line conversion section according to Comparative Example 1. FIG. 13 is a cross-sectional view taken along the line XIII-XIII of FIG. 12. Note that, as shown in FIG. 12, an interlayer insulating film 105, and a gate insulating film 102 is omitted for ease of explanation, and positions where a first contact hole 161 and a second contact hole 162 are formed are illustrated.

Referring to FIG. 13, a line conversion section 153 of a TFT array substrate 200 includes an insulating substrate 101, a common capacitor electrode layer 115, the gate insulating film 102, common lines 123, the interlayer insulating film 105, and a connection layer 133.

The common capacitor electrode layer 115 is formed on the insulating substrate 101 and formed of a first conductive film 110 which is formed in the same layer as that of gate lines 111, common capacitor lines 113, a gate electrode (not shown), and the like. The gate insulating film 102 is formed on the common capacitor electrode layer 115 so as to cover the common capacitor electrode layer 115. Further, the common lines 123 are formed on the gate insulating film 102 and opposed to the common capacitor electrode layer 115 with the gate insulating film 102 interposed therebetween. The common lines 123 are each made of a second conductive film 120 which is formed in the same layer as that of source lines, source/drain electrodes, and the like.

The interlayer insulating film 105 is formed to cover the common lines 123 and the gate insulating film 102. Further, the connection layer 133 is formed on the interlayer insulating film 105. The connection layer 133 is electrically connected to the common lines 123 through the first contact hole 161 penetrating the interlayer insulating film 105. Similarly, the connection layer 133 and the common capacitor electrode layer 115 are electrically connected to each other through the second contact hole 162 penetrating the interlayer insulating film 105 and the gate insulating film 102. In this structure, an external potential supplied from a common terminal 124 is transferred to the common capacitor electrode layer 115 through the common lines 123 and the connection layer 133, and the potential is further supplied to the common capacitor lines 113. Note that the connection layer 133 is formed of the same conductive film as that forming the pixel electrodes.

In the line conversion section 153 according to Comparative Example 1, the first contact hole 161 is formed on the common line 123 and the second contact hole 162 is formed to penetrate the common line 123 as shown in FIG. 13 so that signals are transmitted from the common lines 123 to the common capacitor electrode layer 115.

In the case of a transmissive-type liquid crystal display device, the connection layer 133 for connecting the common lines 123 to the common capacitor electrode layer 115 is generally made of a transparent conductive film material such as ITO in the line conversion section 153 according to Comparative Example 1. The volume resistivity of ITO or the like is about two orders of magnitude greater than that of metal as described above. For this reason, it is necessary to provide a large contact area when ITO or the like is used as a material of the connection layer 133.

According to Comparative Example 1, it is necessary to form the first contact hole 161 and the second contact hole 162, which are used for connecting the common lines 123 and the common capacitor electrode layer 115 to each other, in a step after the formation of the interlayer insulating film 105 and before the formation of the pixel electrodes 131.

Figure 4:
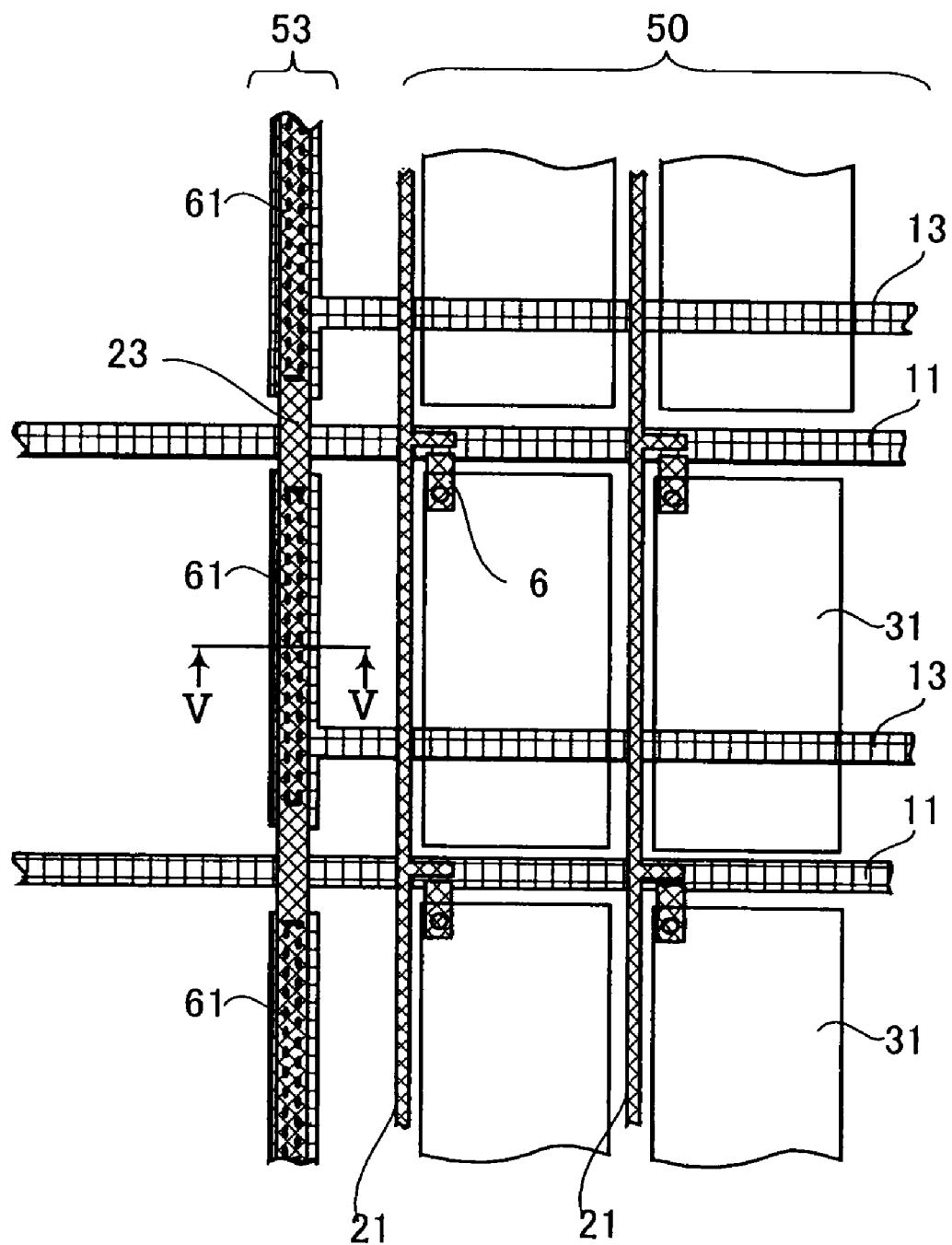
FIG. 4 is a top view showing the vicinity of a line conversion section according to the first exemplary embodiment.
Figure 5:
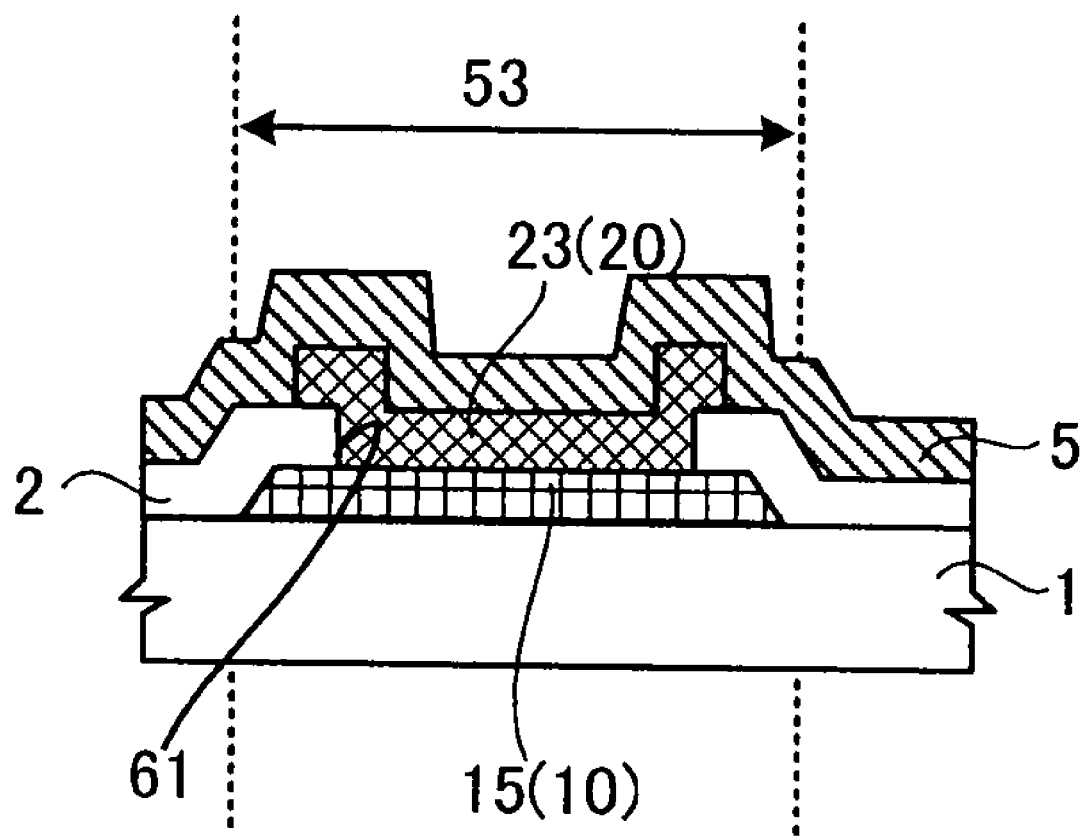
FIG. 5 is a cross-sectional view showing the vicinity of the line conversion section according to the first exemplary embodiment.

Next, referring to FIGS. 4 and 5, a description is given of a method of electrically connecting common capacitor lines to common lines according to the first exemplary embodiment. FIG. 4 is a schematic top view showing the common capacitor lines and the common lines in the vicinity of a line conversion section according to the first exemplary embodiment. FIG. 5 is a cross-sectional view taken along the line V-V of FIG. 4. Note that, as shown in FIG. 4, illustration of the interlayer insulating film 5 and the gate insulating film 2 is omitted for ease of explanation, and positions where first openings 61 are formed are indicated by the dotted lines.

Referring to FIG. 5, a line conversion section 53 of the TFT array substrate 80 includes the insulating substrate 1, the common capacitor electrode layer 15, the gate insulating film 2, the common line 23, and the interlayer insulating film 5. Further, the first openings 61 for connecting the common capacitor electrode layer 15 and the common line 23 to each other is formed in the gate insulating film 2. Referring to FIG. 5, an example in which the first openings 61 each formed in a slit shape is described, but the shape of the first openings 61 is not limited thereto. Alternatively, a plurality of contact holes having a shape such as a square or a circle may be formed.

The common capacitor electrode layer 15 is formed on the insulating substrate 1 and formed of a first conductive film 10 which is formed in the same layer as that of the gate lines 11, the common capacitor lines 13, a gate electrode (not shown), and the like. The gate insulating film 2 is formed on the common capacitor electrode layer 15 so as to cover the common capacitor electrode layer 15. Further, the common line 23 is formed on the gate insulating film 2, and at least a part of the common line 23 is opposed to the common capacitor electrode layer 15 with the gate insulating film 2 interposed therebetween. The common line 23 is made of a second conductive film 20 which is formed in the same layer as that of source lines, source/drain electrodes, and the like.

The interlayer insulating film 5 is formed to cover the common line 23 and the gate insulating film 2. According to the first exemplary embodiment, the common line 23 and the common capacitor electrode layer 15 are electrically connected to each other with the first openings 61, which are formed in the gate insulating film 2, interposed therebetween, without using a film corresponding to the connection layer 133 of Comparative Example 1. In this structure, an external potential supplied from the common terminal 24 is transferred to the common capacitor electrode layer 15 through the common line 23 and is further supplied to the common capacitor lines 13. Note that, in the following description, a region in which the first conductive film 10 and the second conductive film 20 are directly connected to each other is referred to as a "conductive film connecting region". The second conductive film of the conductive film connecting region is coated with an upper-film.

In recent years, there is an increasing demand for a reduction in size and weight of various display devices typified by a liquid crystal display device. Particularly for small liquid crystal display panels having a diagonal size less than about 3 inches, which are used for cellular phones and the like, there is a strong demand for a reduction in size of the frame area in order to secure the large display area 50.

As for the TFT array substrate 80 according to the first exemplary embodiment, the width of the line conversion section 53 can be narrowed. The line conversion section 153 according to Comparative Example 1 needs to have a width of about 100 μm. On the other hand, the width of the line conversion section 53 according to the first exemplary embodiment can be set to about 10 μm, for example. According to the first exemplary embodiment, the common capacitor electrode layer 15 is brought into direct contact with the common line 23, thereby making it possible to reduce the number of contact hole patterns as compared with the case of using the connection layer 133 as a conductive film that forms each pixel electrode. Further, the first conductive film and the second conductive film can be connected together by being brought into contact with each other without using ITO or the like having a high volume resistivity, thereby making it possible to reduce the size of the contact area itself. Furthermore, the structure of the TFT array substrate according to the present invention has a simpler than that of the case to connect the first conductive film and the second conductive film through the third conductive film, which results in enhancement of the production yield.

Next, referring to FIGS. 6A to 6I, a description is given of a method of manufacturing the TFT array substrate having the structure as described above. FIGS. 6A to 6I each show a cross-sectional structure of a TFT formation region 54 on the right side and also show the line conversion section 53 on the left side.

First, the first conductive film 10 is deposited on the insulating substrate 1 which is, for example, a glass substrate, by using a method such as deposition. The first conductive film is, for example, Cr, Al, Mo, W, an alloy containing these metals, or a stacked film of these metals. Then, the gate lines 11, the common capacitor electrode layer 15, the gate electrode 16, and the like are formed into a desired shape through the processes such as a photolithography process, an etching process, and a resist removing process.

Figure 6A:
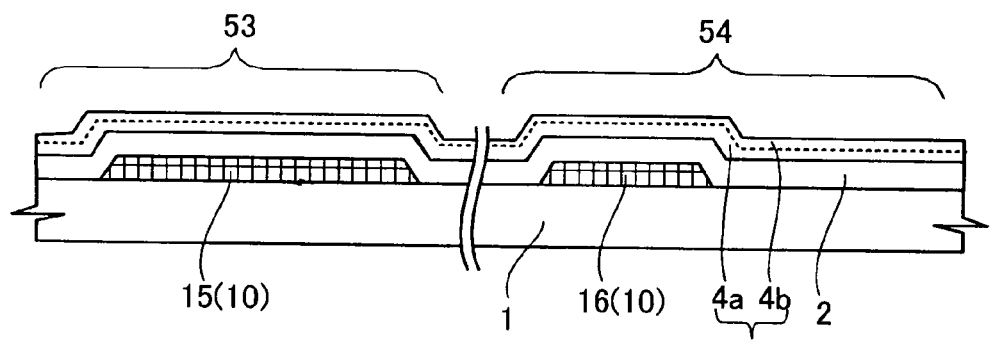
FIGS. 6A to 6I are diagrams each showing a manufacturing process for the TFT array substrate according to the first exemplary embodiment.

Next, after a cleaning process and the like are carried out, the gate insulating film 2, and the first semiconductor layer 4a and the second semiconductor layer 4b, each of which functions as a semiconductor layer, are sequentially deposited on the gate electrode 16, the insulating substrate 1, and the like by various chemical vapor deposition (CVD) methods such as plasma CVD (see FIG. 6A). The gate insulating film 2 is, for example, $SiN_x$ or $SiO_y$. The first semiconductor layer 4a is a pure semiconductor containing no conductive impurities, that is, a so-called intrinsic semiconductor. For the first semiconductor layer 4a, a-Si (amorphous silicon) or the like is used. For the second semiconductor layer 4b, an $n^+$ a-Si ($n^+$ amorphous silicon) film which is an n-type semiconductor film obtained by doping a small amount of phosphorus (P) or the like into a-Si, for example, is used.

The first semiconductor layer 4a and the second semiconductor layer 4b are preferably formed in the same chamber. When the first semiconductor layer 4a and the second semiconductor layer 4b are formed in the same chamber, the electrical connection resistance between two kinds of silicon can be reduced. As a matter of course, the gate insulating film 2 may also be formed in the same chamber. Hereinafter, if it is not necessary to distinguish the first semiconductor layer 4a from the second semiconductor layer 4b, both the layers are collectively referred to as a semiconductor layer 4.

Figure 6B:
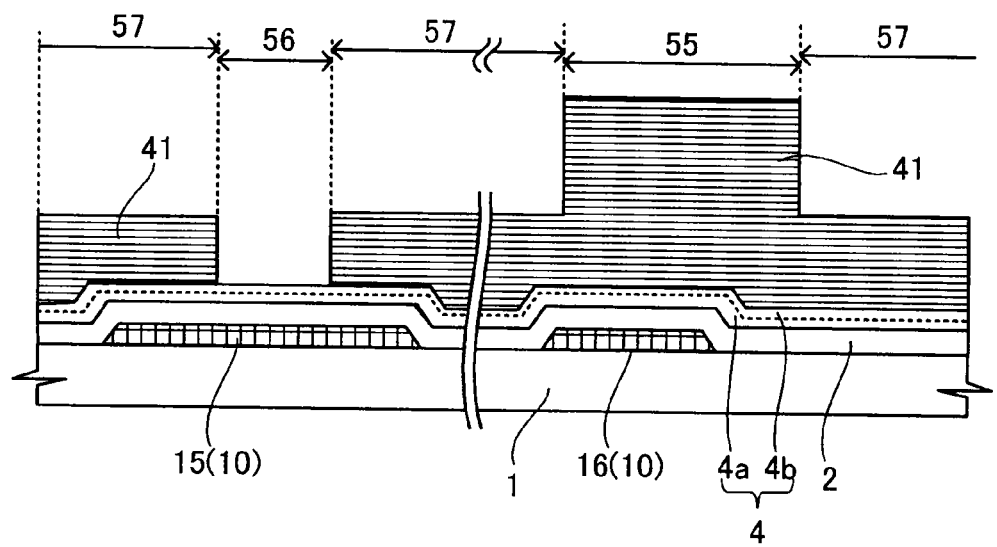

Next, a resist made of a photosensitive resin is coated on the semiconductor layer 4 by spin coating. Further, the coated resist is exposed to light through a photomask (not shown). Referring to FIG. 6B, the photomask in which a light-shielding region 55, a transmissive region 56, and halftone exposure regions 57 are arranged in a desired pattern is used. The halftone exposure regions 57 each have a transmittance lower than that of the transmissive region 56. Then, a series of photolithography processes involving exposure and development are carried out. Specifically, a region in which the first opening 61 is formed on a common capacitor electrode layer 15 is the transmissive region 56, and a region having the semiconductor layer 4 formed into an island shape is the light-shielding region 55. Further, regions in which the semiconductor layer 4 is removed are the halftone exposure regions 57.

Thus, the resist formed on an exposed section is removed and a first resist pattern 41 as shown in FIG. 6B is obtained. Specifically, in the transmissive region 56, the semiconductor layer 4 is exposed at the surface when the resist is removed. In the light-shielding region 55 which is an unexposed portion, a resist pattern having a given film thickness is formed without removing the resist. In the halftone transmissive region 57 which is a half-exposed portion, the resist is removed to such a degree that the resist is not exposed at the surface of the semiconductor layer 4, thereby forming a pattern with a film thickness smaller than the given film thickness of the light-shielding region 55. In other words, as the first resist pattern 41, a pattern having two step structures formed at each of the unexposed portion and the half-exposed portion in the film thickness direction is obtained.

Then, an etching process is carried out. As a result, the exposed portion of the semiconductor layer 4 and the portion of the gate insulating film 2, which is positioned below the exposed portion of the semiconductor layer 4, are removed, and the first opening 61 is formed on the common capacitor electrode layer 15 (see FIG. 6C). After that, a thin portion of the first resist pattern 41 is removed, and an ashing process is carried out so that the portion of the semiconductor layer 4, which is formed below the thin portion of the first resist pattern 41, is exposed (see FIG. 6D). In the ashing process, known systems such as a RIE-DE system and a UV Asher can be used. Through the ashing process, a thick portion of the light-shielding region 55 is also reduced in thickness by ashing but still remains as the resist pattern.

Figure 6C:
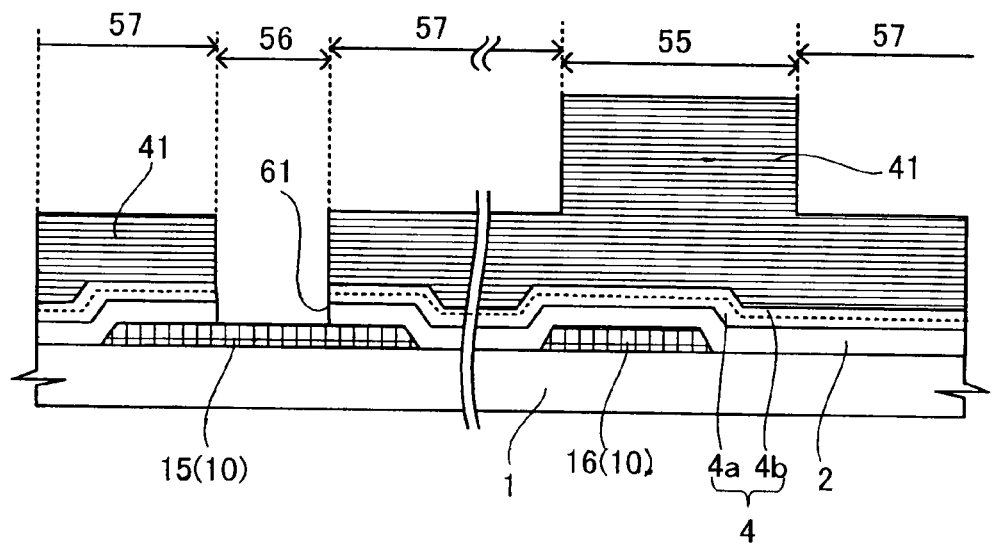
Figure 6D:
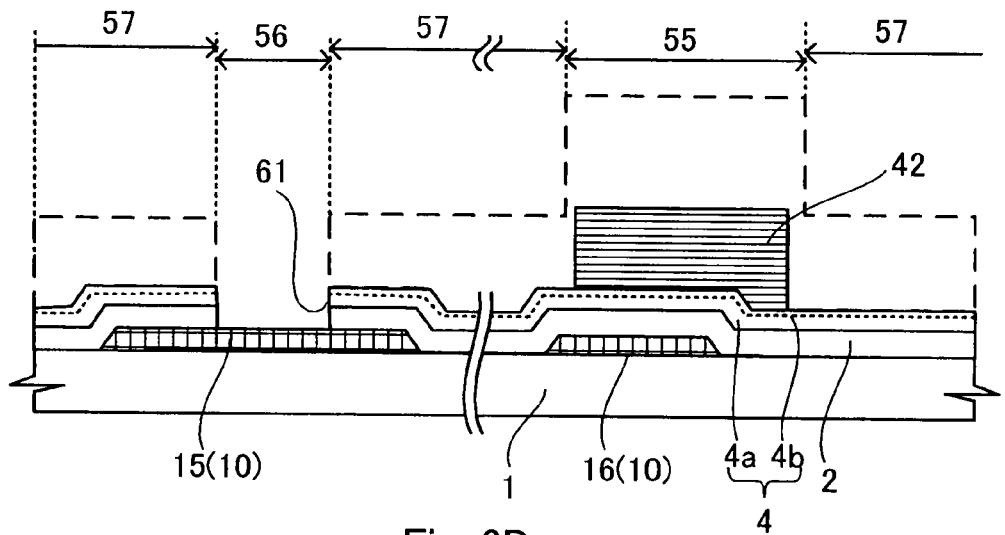

By the ashing process for the first resist pattern 41, a second resist pattern 42 as shown in FIG. 6D is obtained. The second resist pattern 42 is formed of a pattern corresponding to a region of the semiconductor layer 4 which is to be formed into an island shape.

Figure 6E:
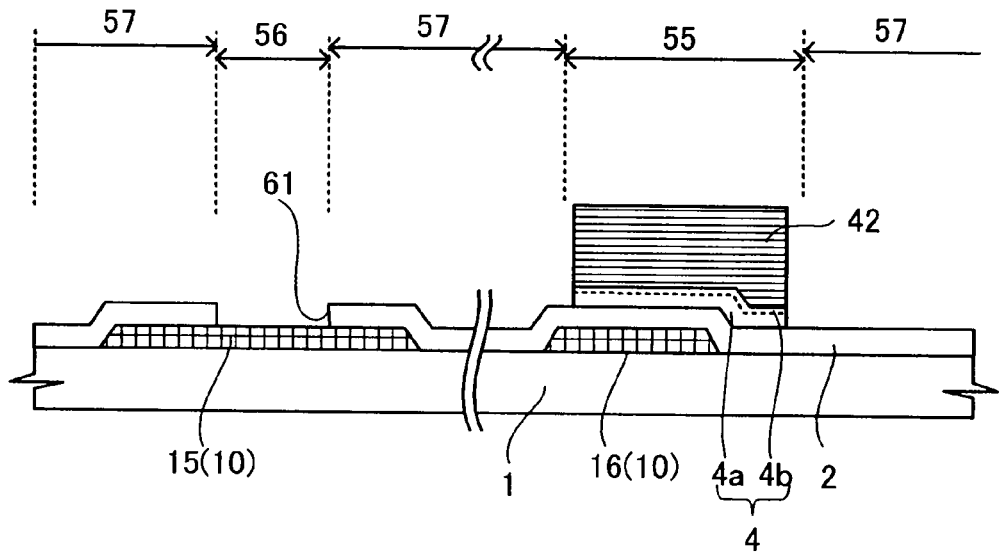

An exposed portion of the semiconductor layer 4 is removed by etching using the second resist pattern 42 as a mask (see FIG. 6E). As a result, the portion of the semiconductor layer 4 which corresponds to the TFT formation region is formed into an island shape, thereby obtaining a desired pattern. Though the common capacitor electrode layer 15 is exposed at the first opening 61, the etching selectivity of the semiconductor layer 4 can be adequately secured, since Al, Cr, Mo, W, or an alloy mainly composed of these metals is generally used for the common capacitor electrode layer 15. After the exposed portion of the semiconductor layer 4 is removed by etching, the second resist pattern 42 is removed.

Figure 6F:
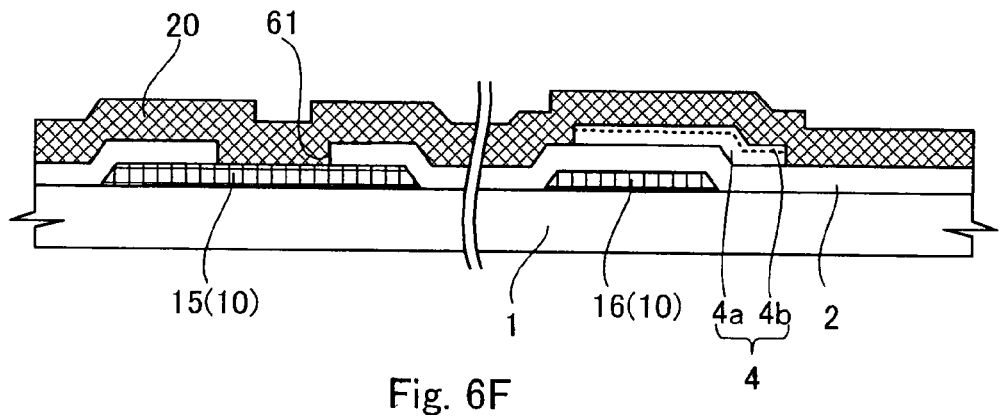
Figure 6G:
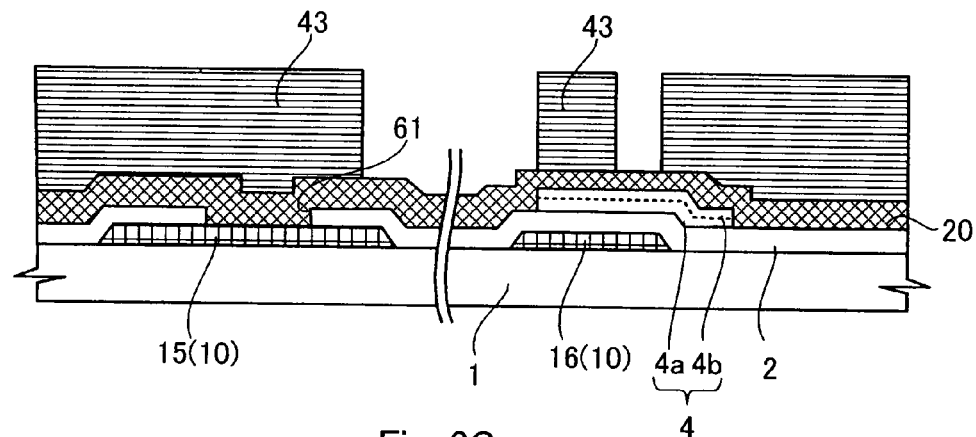
Figure 6H:
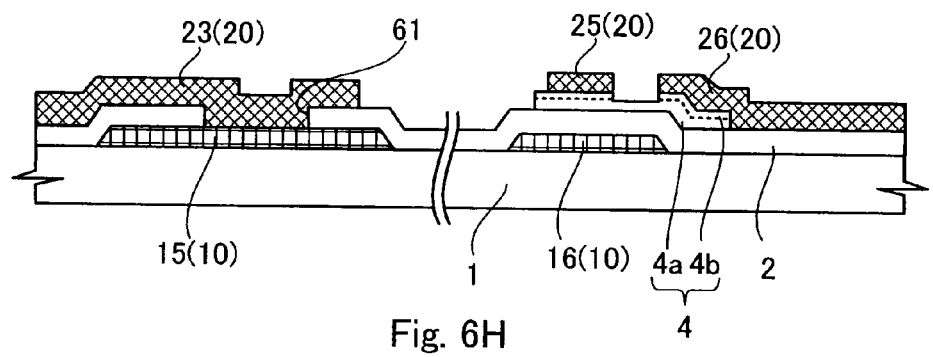

Then, the second conductive film 20 is deposited by sputtering or the like to cover the common capacitor electrode layer 15, the gate insulating film 2, and the semiconductor layer 4 (see FIG. 6F). Further, a third resist pattern 43 is formed by a photolithography process (see FIG. 6G). Then, an etching process is carried out using the third resist pattern 43 as a mask, thereby obtaining the source electrode 25, the drain electrode 26, the source line 21, the common line 23, and the like each having a desired shape. After that, a part of the semiconductor layer 4 which corresponds to a back channel portion of the TFT 6 is etched. In this case, a portion of the second semiconductor layer 4b, which is located on the side of the source electrode 25, and a portion thereof, which is located on the side of the drain electrode 26, are separated from each other, thereby forming the TFT functioning as a switching element (see FIG. 6H).

Figure 6I:
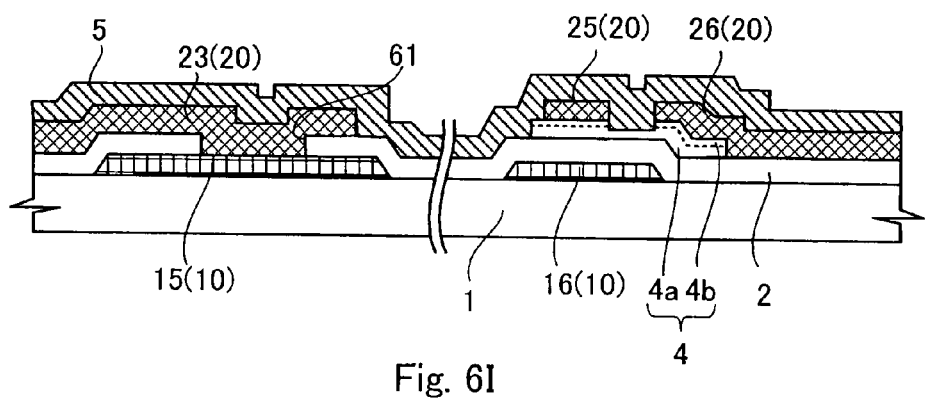

After that, the interlayer insulating film 5 is formed using various CVD methods such as plasma CVD so as to cover the gate insulating film 2, the channel region, the source electrode 25, the drain electrode 26, the common line 23, and the like (See FIG. 6I). For the interlayer insulating film 5, $SiN_x$, $SiO_y$, or the like, or a mixture or a deposit thereof can be used. In the case of mounting the TFT 6 on a liquid crystal display device, the second contact hole 62 is formed in the interlayer insulating film 5 after the second resist pattern 42 is removed, and the transparent conductive film 30 serving as the pixel electrode 31 is deposited. Further, the pixel electrode 31 and the drain electrode 26 are electrically connected to each other after the processes such as the photolithography process, the etching process, and the resist removing process. Through a series of processes, the line conversion section 53 shown in FIG. 5 and the TFT 6 shown in FIG. 3 are formed on the substrate.

Note that the second conductive film 20 is coated with an upper-layer film to prevent an exposed area from being formed. As the upper-layer film, a protective film such as an interlayer insulating film or a passivation film can be used. As a material of the upper-layer film, an inorganic film such as a silicon nitride film or a silicon oxide film, or an organic insulating film may be used. Alternatively, a stacked film of these films may be used. Further, for a region having an exposed surface required to have conductivity, such as the terminal section, a transparent conductive film made of ITO, ITZO, IZO, or the like may be preferably used according to the present invention.

Further, as a method of carrying out the halftone exposure, a so-called "halftone mask" technique in which a pattern is formed using a material having a given transmittance in the mask used for photolithography can be employed. Alternatively, a pattern mask having a geometric pattern such as a mesh-like or checker-like pattern formed with the dimensions below the resolution limit for exposure light, or a pattern mask having an L/S (line/space) pattern or the like may be used. According to the first exemplary embodiment, it is sufficient that the exposed area of the first conductive film 10 is formed and the semiconductor layer 4 is formed into an island shape as described above. Thus, a resist pattern having a step structure can be formed using a known photomask.

The TFT array substrate manufactured as described above are mounted on a liquid crystal display device together with a color filter substrate, a backlight, a liquid crystal, and the like, through known manufacturing processes.

According to Comparative Example 1, the first conductive film and the second conductive film are separately surrounded by the insulating film until the connection layer formed of a transparent conductive film such as ITO is formed. Accordingly, when the glass substrate becomes charged during the process, discharge may occur between layers or between lines formed in the same layer, which causes the display device to be a defective product. According to the first exemplary embodiment, a connection section between the first conductive film 10 and the second conductive film 20 is formed in the early stages of the process of manufacturing the TFT array substrate. As a result, even if abnormal electrical discharge occurs, a passage for discharging abnormal static electricity is formed because of the presence of a connection region, thereby effectively preventing a defective product from being produced.

According to the first exemplary embodiment, the common capacitor electrode layer 15 formed of the first conductive film 10 and the common line 23 made of the second conductive film 20 are electrically connected together by being brought into contact with each other in the line conversion section 53, which leads to a reduction in width of the common line 23. Furthermore, metallic materials are connected together without using a material having high volume resistivity, such as ITO, thereby achieving a reduction in contact area. As a result, a narrower frame can be achieved.

Further, according to the first exemplary embodiment, the second conductive film is coated with the upper-layer film (interlayer insulating film is used in the first exemplary embodiment) so that the second conductive film is not exposed. Accordingly, there is no fear of corrosion of the second conductive film. Thus, it is possible to provide a TFT array substrate with high reliability. Further, it is not necessary to add a mask for forming an opening in the gate insulating film 2, and it is also not necessary to carry out another photolithography process for connecting the first conductive film 10 and the second conductive film 20 to each other. In short, the above-mentioned effects can be obtained through a small number of photolithography processes. Accordingly, a reduction in costs can be achieved.

Further, as compared with the case where the first conductive film and the second conductive film are connected to each other through the connection layer 133 as in Comparative Example 1, the structure according to the present invention is simplified because the first conductive film 10 and the second conductive film 20 are brought into contact with each other. Furthermore, since the first conductive film 10 and the second conductive film 20 are directly connected to each other in the conductive film connecting region, a coverage failure of the connection layer 133 does not occur unlike Comparative Example 1. Accordingly, the ingress of moisture or the like due to the coverage failure can be prevented, thereby making it possible to provide a display device with high reliability.

Second Exemplary Embodiment

Next, a description is given of an example of a method of manufacturing a TFT array substrate different from that of the first exemplary embodiment. Note that, in the following description, the components identical with those of the first exemplary embodiment are denoted by the same reference symbols, and a description thereof is omitted.

A method of manufacturing a TFT array substrate according to a second exemplary embodiment of the present invention is similar to the manufacturing method according to the first exemplary embodiment except for the following points. That is, according to the first exemplary embodiment, both the semiconductor layer 4 and the gate insulating film 2 are removed by an etching process using the first resist pattern 41 as a mask. On the other hand, according to the second exemplary embodiment, only the semiconductor layer 4 is first removed by an etching process using the first resist pattern 41 as a mask. Further, an exposed portion of the insulating film 2 is removed by an etching process using the exposed semiconductor layer 4 as a mask after the second resist pattern 42 is formed, and the exposed semiconductor layer 4 is then removed by an etching process.

Figure 7A:
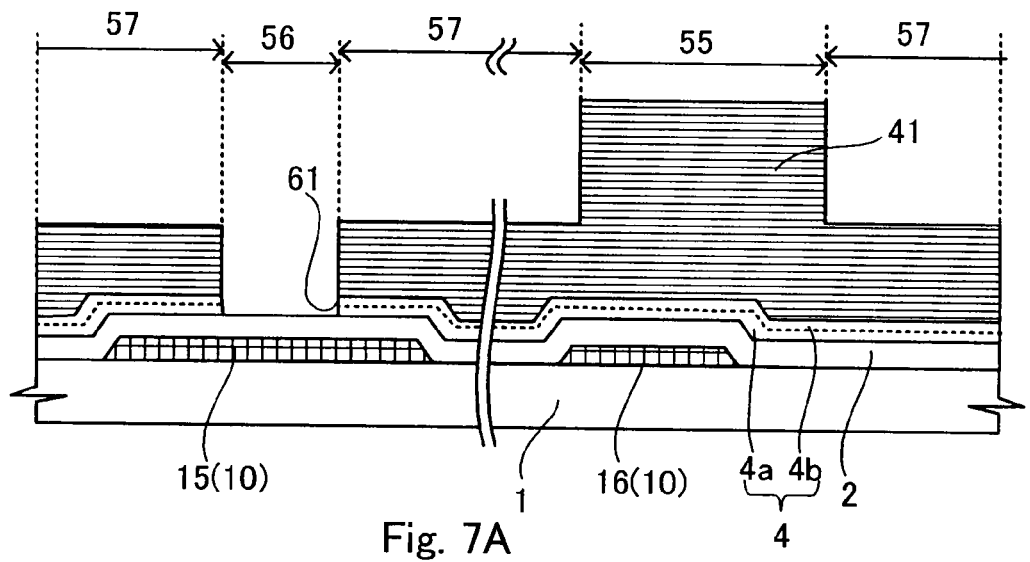
FIGS. 7A to 7C are diagrams each showing a manufacturing process for a TFT array substrate according to a second exemplary embodiment of the present invention.
Figure 7B:
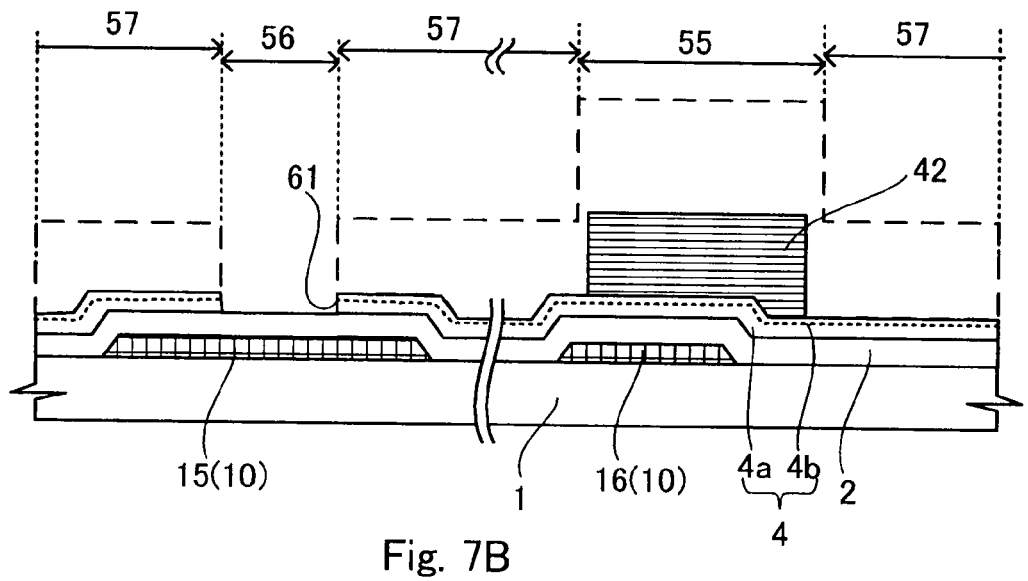
Figure 7C:
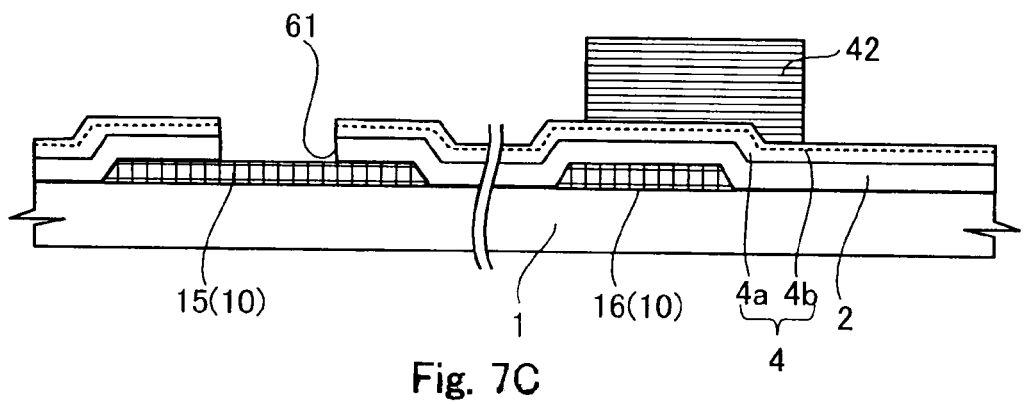

FIGS. 7A to 7C are cross-sectional views for explaining the manufacturing process for the TFT array substrate according to the second exemplary embodiment. In a similar manner as in the first exemplary embodiment, the gate electrode 16, the gate line 11, the gate insulating film 2, the semiconductor layer 4, and the first resist pattern 41 are formed on the insulating substrate 1 (see FIG. 6B). Then, the semiconductor layer 4 is removed by an etching process using the first resist pattern 41 as a mask (see FIG. 7A).

After that, a thin portion of the first resist pattern 41 is removed, and an ashing process is carried out so that a portion of the semiconductor layer 4, which is formed below the thin portion of the first resist pattern 41, is exposed. Through the ashing process for the first resist pattern 41, the second resist pattern 42 as shown in FIG. 7B is obtained. The second resist pattern 42 is formed of a pattern corresponding to a region of the semiconductor layer 4 which is to be formed into an island shape.

Then, an exposed portion of the gate insulating film 2 is removed by etching using the exposed portion of the semiconductor layer 4 as a mask (see FIG. 7C). After that, the exposed portion of the semiconductor layer 4 is removed by etching using the second resist pattern 42 as a mask. As a result, the semiconductor layer 4 corresponding to the TFT formation region is formed into an island shape, and a desired pattern is obtained. After the exposed semiconductor layer 4 is removed by etching, the second resist pattern 42 is removed. Then, in a similar manner as in the first exemplary embodiment, the line conversion section 53 shown in FIG. 5 and the TFT 6 shown in FIG. 3 are formed.

According to the manufacturing method for the TFT array substrate of the second exemplary embodiment, breakage of the gate electrode due to abnormal electrical discharge can be effectively prevented. The reason for this is as follows. That is, when the structure shown in FIG. 6C is obtained by etching the semiconductor layer 4 and the gate insulating film 2 by using the first resist pattern 41 as a mask, only a small partial area of the first conductive film 10, which is made of a conductive material and covered with the insulating layer, is exposed. In this case, if the state of plasma becomes unstable during a dry etching process, there is a fear that abnormal electrical discharge may occur and the first conductive film 10 (common capacitor electrode layer 15) may be destroyed depending on the conditions.

According to the method of manufacturing the TFT array substrate of the second exemplary embodiment, a major part of the surface of the semiconductor layer 4 is exposed when the gate insulating film 2 is etched. Accordingly, even when a part of the first conductive film 10 (common capacitor electrode layer 15) is exposed, the size of a conductive area is not rapidly changed. Thus, the breakage of the gate electrode due to the abnormal electrical discharge is prevented.

Third Exemplary Embodiment

Next, a description is given of an example in which a conductive film connecting region for electrically connecting the first conductive film 10 and the second conductive film 20 together by being brought into contact with each other is formed in a drive circuit section of the TFT array substrate. The structure of a TFT array substrate according to a third exemplary embodiment of the present invention is basically the same as that of the first exemplary embodiment.

As described above, a semiconductor chip (hereinafter, referred to as "IC" (Integrated Circuit)) having a gate driving circuit and a source driving circuit (hereinafter referred to as "drive circuit") incorporated therein, for driving a liquid crystal, is directly connected to the terminal section of the TFT array substrate, or the IC and the terminal section are connected to each other through a flexible printed circuit board (hereinafter referred to as "FPC") or the like, thereby making it possible to display a desired image. In this case, it is necessary to prepare an additional IC, which inevitably increases the manufacturing costs. Thus, the number of ICs for use is reduced by forming the circuit on the TFT array substrate at the time of forming a TFT of each pixel. Alternatively, the added value of a display device can be increased by forming a circuit having an additional function. According to the third exemplary embodiment, a description is given of an example in which the present invention is applied to the case where the drive circuit is formed in the frame area 51 of the TFT array substrate.

Figure 8:
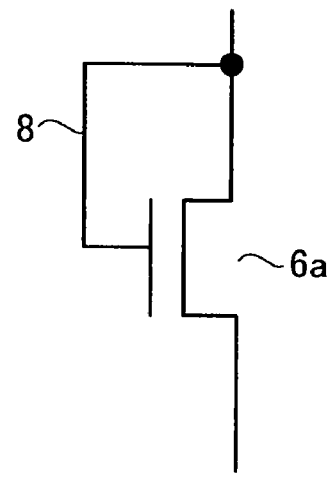
FIG. 8 is a circuit diagram showing a TFT formed in a drive circuit section.

When a value-added circuit as well as minimum functions required for a display device is mounted, a connection section 8 is formed between source/drain electrodes and a gate electrode of a TFT 6*a* as shown in FIG. 8. Various logic circuits can be constituted by a combination of the circuit having the connection section 8 and other functions.

Figure 14:
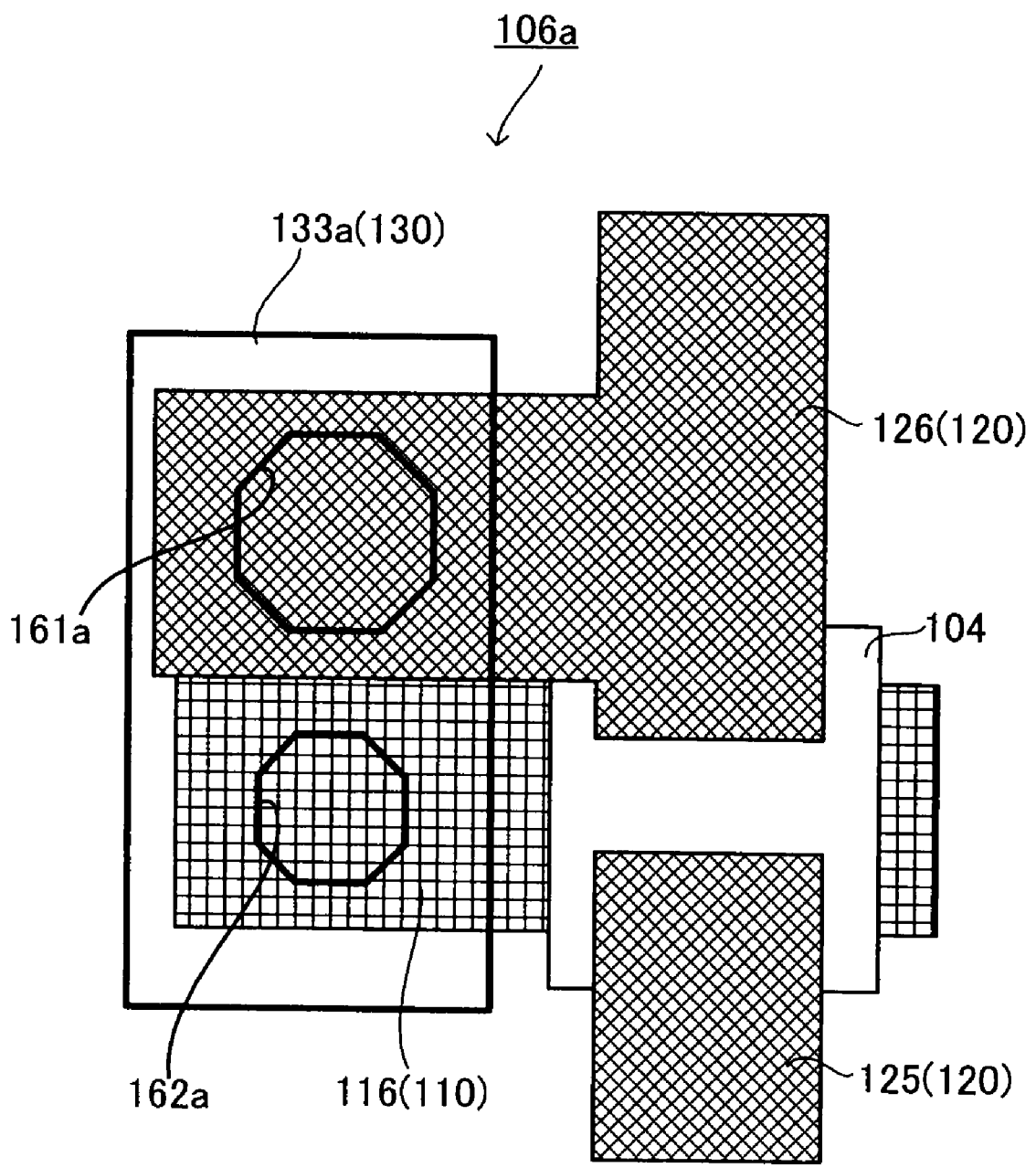
FIG. 14 is a partial enlarged top view showing a drive circuit section of a TFT array substrate according to Comparative Example 2.

FIG. 14 is a schematic top view showing the vicinity of a TFT 106*a* of a drive circuit according to Comparative Example 2. Note that, as shown in FIG. 14, illustration of the gate insulating film and the interlayer insulating film is omitted for ease of explanation and the conductive film forming the connection layer is indicated by the solid lines. Further, positions where contact holes are formed are indicated by the solid lines.

Referring to FIG. 14, in the TFT 106*a* of the drive circuit according to Comparative Example 2, a gate electrode 116 made of the first conductive film 110 is opposed to a source electrode 125 and a drain electrode 126, each of which is made of the second conductive film 120, with a semiconductor layer 104 and a gate insulating film (not shown) interposed therebetween. An interlayer insulating film (not shown) is formed on the source electrode 125 and the drain electrode 126, and a connection layer 133*a* formed of a third conductive film 130 is further formed on the interlayer insulating film. The connection layer 133*a* is electrically connected to the drain electrode 126 through a first contact hole 161*a* penetrating the interlayer insulating film (not shown). Similarly, the connection layer 133*a* is electrically connected to the gate electrode 125 through a second contact hole 162*a* penetrating the interlayer insulating film (not shown) and the gate insulating film (not shown). Thus, the gate electrode 125 and the source/drain electrodes are electrically connected to each other.

In a drive circuit section according to Comparative Example 2, it is necessary to form the first contact hole 161*a* on the drain electrode 126 and form the second contact hole 162*a* on the gate electrode 116 as shown in FIG. 14 so that the gate electrode and the source/drain electrodes are electrically connected to each other. Further, in a similar manner as in Comparative Example 1, a transparent conductive film material such as ITO is generally used for the connection layer 133*a* of a transmissive-type liquid crystal display device. As described above, ITO or the like has a volume resistivity that is about two orders of magnitude greater than that of metal. For this reason, it is necessary to provide a large contact area when ITO or the like is used as a material of the connection layer 133*a*.

Figure 9:
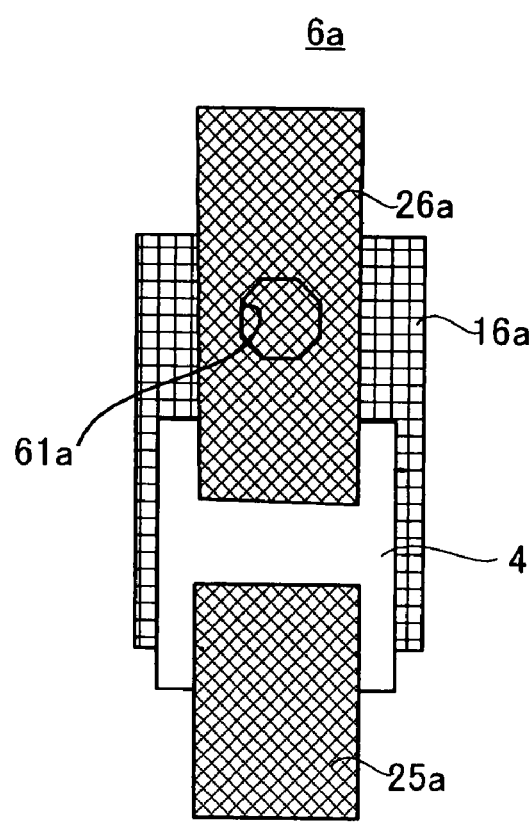
FIG. 9 is a schematic top view showing a TFT formed in a drive circuit section according to a third exemplary embodiment of the present invention.

On the other hand, according to the third exemplary embodiment, a drain electrode 26*a* and a gate electrode 16*a* are brought into contact with each other as shown in FIG. 9. In this case, since metals are connected to each other, the contact area of the connection section can be reduced compared to the connection between ITO and metal. Accordingly, a desired connection can be established with a small area, thereby realizing a narrower frame.

Furthermore, the lines and contacts of the drive circuit are desirably set to have a small resistance in order to minimize a propagation delay of drive signals. According to the third exemplary embodiment, the layer formed of the first conductive film and the layer formed of the second conductive film, each of which is made of a highly conductive metal, are brought into contact with each other without ITO having high resistance interposed therebetween. Accordingly, it is possible to provide a sophisticated drive circuit.

Further, according to the manufacturing method of the third exemplary embodiment, it is possible to form a drive circuit having a contact portion between metal lines (first conductive film and second conductive film) at a desired position without increasing the number of photolithography processes. Furthermore, the lines are coated with the interlayer insulating film 5 so that a source electrode 25*a* and the drain electrode 26*a*, each of which is made of the second conductive film 20, are not exposed. Accordingly, there is no fear of corrosion of the lines. As a result, it is possible to provide a display device with high reliability while achieving a reduction in costs.

Fourth Exemplary Embodiment

A description is given of an example in which a conductive film connecting region for directly connecting the first conductive film 10 and the second conductive film 20 to each other, in a terminal of the TFT array substrate. The structure of a TFT array substrate according to a fourth exemplary embodiment of the present invention is basically the same as that of the first exemplary embodiment.

Figure 10:
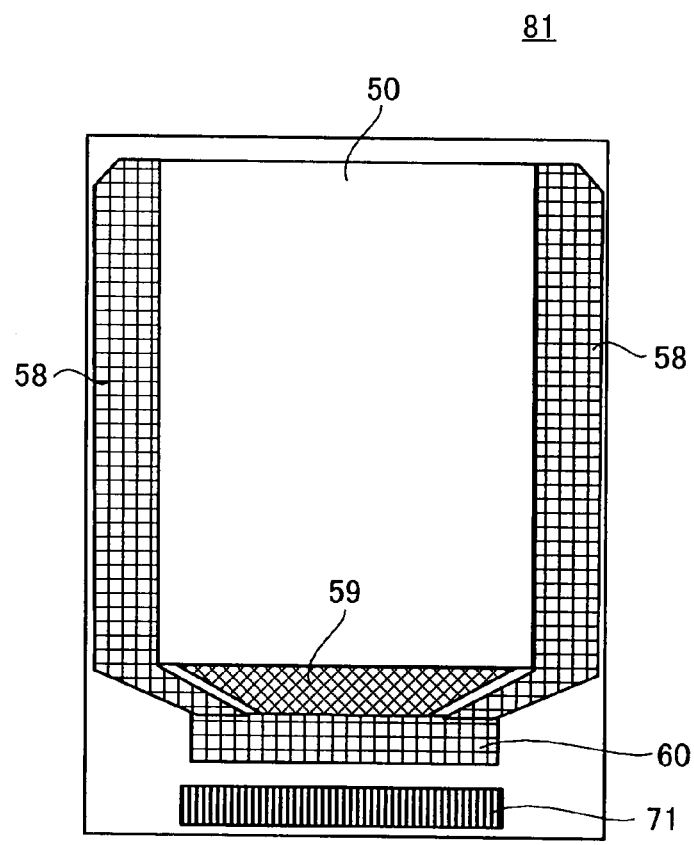
FIG. 10 is a schematic plane view showing a liquid crystal display panel according to a fourth exemplary embodiment of the present invention.

FIG. 10 is a schematic top view showing a liquid crystal display panel according to the fourth exemplary embodiment. In this case, a description is given of the case where a drive circuit and the like are mounted by using a chip-on-glass (COG) technology in the same manner as in the third exemplary embodiment. A liquid crystal display panel 81 has the display area 50 and the frame area 51 (see FIG. 1) located outside the display area 50 as described above. Referring to FIG. 10, the frame area 51 includes a gate line area 58, a source line area 59, a drive circuit mounting area 60, and an external terminal area 71.

The gate lines 11 extend to the drive circuit mounting area 60 through the gate line area 58 of the frame area 51 from the display area 50. Similarly, the source lines 21 extend to the drive circuit mounting area 60 through the source line area 59 of the frame area 51 from the display area 50.

The external terminal area 71 and the drive circuit mounting area 60 are connected to each other via a line (not shown). A terminal (not shown) formed in the external terminal area 71 is supplied with an external signal from a flexible printed circuit (FPC) and the like. Further, various signals input from the outside are supplied to a drive circuit (not shown) provided in the drive circuit mounting area 60 from the external terminal area 71. In the drive circuit mounting area 60, the gate terminal of each of the gate lines 11 and the source terminal of each of the source lines 21 are provided. Further, the drive circuit supplies gate signals to the gate lines and display signals to the source lines in response to a control signal input from the outside. As a result, a display voltage corresponding to display data is supplied to each pixel electrode.

Figure 15:
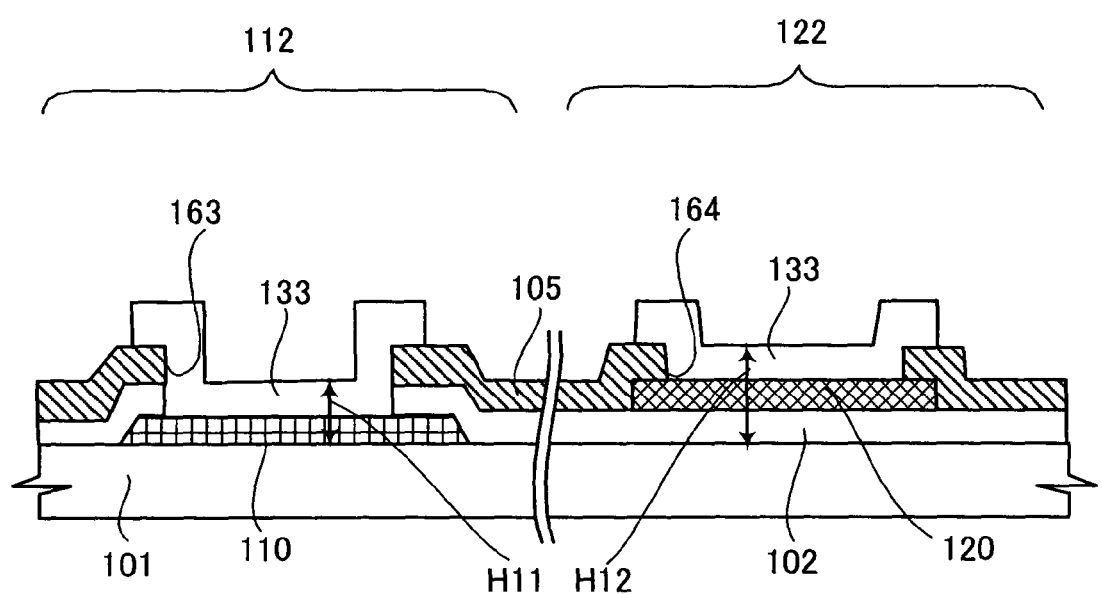
FIG. 15 is a cross-sectional view showing a terminal section of a TFT array substrate according to Comparative Example 3.

FIG. 15 is a schematic cross-sectional view showing a gate terminal 112 and the source terminal 122 which are formed in the drive circuit mounting area according to Comparative Example 3. FIG. 15 shows the vicinity of the area of the gate terminal 112 on the left side and shows the vicinity of the area of the source terminal 122 on the right side.

According to Comparative Example 3, the gate terminal 112 has a pattern of the first film 110 formed in the same layer as that of the gate electrode 116 and the like, and the connection layer 133 formed of the third conductive film 130 is connected to the first conductive film 110 through a third contact hole 163 formed in the gate insulating film 102. Likewise, the source terminal 122 has a pattern of the second conductive film 120 formed in the same layer as that of the source electrode 126 and the like, and is connected to the connection layer 133, which is formed of the third conductive film 130, through a fourth contact hole 164 formed in the interlayer insulating film 105. In short, the gate terminal 112 has layers of the first conductive film 110 and the third conductive film 130, and the source terminal 122 has layers of the second conductive film 120 and the third conductive film 130. Thus, as shown in FIG. 15, there is a difference in height between the gate terminal 122 and the source terminal 122, that is, a height H11 of the gate terminal 122 is different from a height H12 of the source terminal 122.

In the case of using the drive circuit in which both a gate drive circuit and a source drive circuit are mounted to a single chip, when the height of the gate terminal 112 is different from that of the source terminal 122 in, there is a fear that a connection failure may occur in a lower one of the terminals. Particularly in a small panel or the like, the connection failure is more likely to occur because a single IC having both a gate driving circuit and a source driving circuit mounted thereon is sometimes used.

Figure 11:
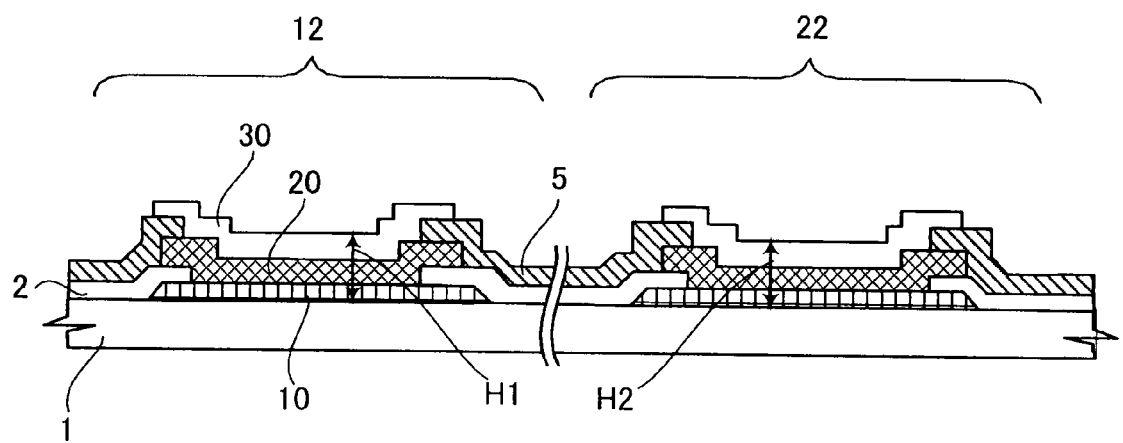
FIG. 11 is a cross-sectional view showing a terminal section of the liquid crystal display panel according to the fourth exemplary embodiment.

FIG. 11 is a schematic cross-sectional view showing the gate terminal 12 and the source terminal 22 which are formed in the drive circuit mounting area according to the fourth exemplary embodiment. FIG. 11 shows the vicinity of the area of the gate terminal 12 on the left side and shows the vicinity of the area of the source terminal 22 on the right side.

According to the fourth exemplary embodiment, the gate terminal 12 has a pattern of the first conductive film 10 formed in the same layer as that of the gate electrode 16 and the like, and also has a pattern of the second conductive film 20 through a contact hole formed in the gate insulating film 2. Further, the third conductive film 30, which is formed on the pattern of the second conductive pattern 20, is connected to the second conductive film 20. Likewise, the source terminal 22 has the pattern of the first conductive film 10 formed in the same layer as that of the gate electrode 16 and the like, and also has the pattern of the second conductive film 20 through the contact hole formed in the gate insulating film 2. Further, the third conductive film 30, which is formed on the pattern of the second conductive pattern 20, is connected to the second conductive film 20. Thus, as shown in FIG. 11, the heights of the gate terminal 12 and the source terminal 22 are the same, that is, the height H1 of the gate terminal 12 is the same as the height H2 of the source terminal 22.

According to the fourth exemplary embodiment, the gate terminal 12 and the source terminal 22 have the same structure, thereby overcoming the problem inherent in Comparative Example 3. In other words, according to the fourth exemplary embodiment, the height of the gate terminal 12 is set to be equal to that of the source terminal 22, thereby preventing the connection failure occurring in the terminal section.

Note that it is also possible to employ a method of forming the gate terminal and the source terminal into the same structure while employing the structure according to Comparative Example 1. For example, a conversion section is provided halfway along the gate line or the source line, and the height of the gate terminal is set to be equal to that of the source terminal by forming both the gate terminal and the source terminal with the same structure as that of the gate terminal 112 or the source terminal 122 shown in FIG. 15. In this case, when the same structure as that of Comparative Example 1, that is, the structure in which the first conductive and the second conductive film are connected to each other through the third conductive film is employed, the area for forming contact holes and the like increases the size of the frame area. Further, an increase in total resistance of the lines is caused due to line conversion, which is disadvantageous in improving display characteristics.

Fifth Exemplary Embodiment

A description is given of an example in which the present invention is applied to a protection circuit of a TFT array substrate according to a fifth exemplary embodiment of the present invention. The structure of the TFT array substrate according to the fifth exemplary embodiment is basically the same as that of the first exemplary embodiment.

In the same manner as in the drive circuit according to the third exemplary embodiment, when the connection section 8 (see FIG. 8) is provided between the source/drain electrodes and the gate electrode of the TFT also in the protection circuit, various logic circuits can be formed. Referring to FIG. 9, when an area in which the first conductive film 10 and the second conductive film 20 are brought into contact with each other is provided, the same effects as those of the drive circuit according to the third exemplary embodiment can be obtained also in the protection circuit according to the fifth exemplary embodiment.

According to the fifth exemplary embodiment, it is possible to obtain such effects as prevention of corrosion of metal lines in the conductive film connecting region (first conductive film 10 and second conductive film 20), a reduction in resistance of contacts, and a reduction in size of the frame area 51.

Note that the present invention is not limited to examples of the application in accordance with the first to fifth exemplary embodiments. For example, the present invention can be applied to an inspection circuit and the like. In other words, the present invention can be applied to any use in which the first conductive film and the second conductive film need to be connected to each other. Furthermore, examples in which a TFT array substrate is mounted on a liquid crystal display device are described according to the first to fifth exemplary embodiments, but the present invention is not limited thereto. The present invention can be applied to any display device such as an EL display device.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of manufacturing a thin film transistor array substrate, the method comprising the steps of:
   forming a pattern made of a first conductive film on a substrate;
   stacking a gate insulating film, a semiconductor layer, and a resist in the stated order on the first conductive film;
   forming a resist pattern having a step structure in a thickness direction by using a photolithography process with a photomask disposed on the resist;
   forming an exposed area of the first conductive film and a pattern of the semiconductor layer by using the resist pattern;
   forming a pattern made of a second conductive film in contact with the first conductive film in the exposed area of the first conductive film; and
   forming a pattern made of an interlayer insulating film and a pattern made of a third conductive film on the second conductive film, wherein:

the thin film transistor array substrate has a conductive film connecting region in which the first conductive film and the second conductive film are in direct contact with each other through an opening formed in the gate insulating film, and in which the second conductive film is coated with an upper-layer film;

the first conductive film forms a gate electrode of a thin film transistor, and forms a gate line connected to the gate electrode;

the second conductive film forms each of a source electrode and a drain electrode of the thin film transistor, and forms a source line connected to the source electrode; and the third conductive film forms a pixel electrode.

2. The method of manufacturing a thin film transistor array substrate according to claim 1, wherein the step of forming the exposed area of the first conductive film and the pattern of the semiconductor layer includes:

etching the semiconductor layer and the gate insulating film using the resist pattern as a mask to obtain the exposed area of the first conductive film;

forming a second resist pattern such that a thick portion of the resist pattern remains as a pattern; and etching the semiconductor layer using the second resist pattern as a mask to obtain the pattern of the semiconductor layer.

3. The method of manufacturing a thin film transistor array substrate according to claim 1, wherein the step of forming the exposed area of the first conductive film and the pattern of the semiconductor layer includes:

etching the semiconductor layer using the resist pattern as a mask;

forming a second resist pattern such that a thick portion of the resist pattern remains as a pattern;

etching the gate insulating film using as a mask the semiconductor layer exposed during formation of the second resist pattern, to obtain the exposed area of the first conductive film; and etching the semiconductor layer using the second resist pattern as a mask to obtain the pattern of the semiconductor layer.

4. The method of manufacturing a thin film transistor array substrate according to claim 1, wherein the second conductive film formed in the conductive film connecting region is formed in the opening and immediately above the gate insulating film, the opening being formed in the gate insulating film.

5. The method of manufacturing a thin film transistor array substrate according to claim 1, wherein the third conductive film is a transparent conductive film.

6. The method of manufacturing a thin film transistor array substrate according to claim 1, wherein the conductive film connecting region is formed in a region connecting a line made of the first conductive film and a line made of the second conductive film to each other.

7. The method of manufacturing a thin film transistor array substrate according to claim 1, wherein the conductive film connecting region is formed in a drive circuit.

8. The method of manufacturing a thin film transistor array substrate according to claim 1, wherein the conductive film connecting region is formed in a terminal.

9. The method of manufacturing a thin film transistor array substrate according to claim 1, wherein the conductive film connecting region is formed in a protection circuit.

10. The method of manufacturing a thin film transistor array substrate according to claim 1, wherein the upper-layer film is one of a protective film and the third conductive film.

11. A display device, comprising:

a thin film transistor array substrate mounted thereon, the thin film transistor array substrate being manufactured by the method of manufacturing a thin film transistor array substrate according to claim 1.

12. The method of manufacturing a thin film transistor array substrate according to claim 1, wherein:

the conductive film connecting region connects a common line and a common capacitor line of the thin film transistor array.

13. The method of manufacturing a thin film transistor array substrate according to claim 12, wherein:

the width of the conductive film connecting region is about 10 μm.

* * * * *